US010312223B2

(12) United States Patent
Hanya

(10) Patent No.: US 10,312,223 B2
(45) Date of Patent: Jun. 4, 2019

(54) SEMICONDUCTOR LIGHT-EMITTING DEVICE AND METHOD FOR PRODUCING THE SAME

(71) Applicant: STANLEY ELECTRIC CO., LTD., Meguro-ku, Tokyo (JP)

(72) Inventor: Akihiko Hanya, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/710,605

(22) Filed: Sep. 20, 2017

(65) Prior Publication Data
US 2018/0090469 A1 Mar. 29, 2018

(30) Foreign Application Priority Data
Sep. 23, 2016 (JP) ................ 2016-185447

(51) Int. Cl.
H01L 33/62 (2010.01)
H01L 25/00 (2006.01)
(Continued)

(52) U.S. Cl.
CPC ............ *H01L 25/075* (2013.01); *H01L 24/16* (2013.01); *H01L 24/81* (2013.01);
(Continued)

(58) Field of Classification Search
CPC ..... H01L 33/62; H01L 25/50; H01L 25/0753; H01L 25/0756; H01L 2224/16225; H01L 2933/0066; H01L 25/075
See application file for complete search history.

(56) References Cited

U.S. PATENT DOCUMENTS 6,876,149 B2* 4/2005 Miyashita ........... H01L 25/0756
257/96
2003/0132446 A1* 7/2003 Guenther ............ H01L 25/048
257/88
(Continued)

FOREIGN PATENT DOCUMENTS

EP 1452326 A2 9/2004
JP 2006049026 A 2/2006
JP 2014017364 A 1/2014

OTHER PUBLICATIONS

Extended European Search Report (EESR) dated Jan. 4, 2018 in counterpart European Application No. 17191671.1.

*Primary Examiner* — Caridad Everhart
(74) *Attorney, Agent, or Firm* — Holtz, Holtz & Volek PC

(57) ABSTRACT

A light-emitting device having a plurality of light-emitting elements closely adjacently disposed in spite of using only one substrate is provided.
One or more light-emitting elements are flip-chip mounted on each of upper surface and lower surface of a substrate. The light-emitting elements are disposed so that the light-emitting elements on the upper surface of the substrate and the light-emitting elements on the lower surface of the substrate are closely adjacent to each other when they are seen from above the substrate. The light-emitting elements mounted on the upper surface of the substrate have light-emitting surfaces as the upper surfaces, and the light-emitting elements mounted on the lower surfaces of the substrate have light-emitting surfaces on the substrate side. The substrate transmits at least lights emitted by the light-emitting elements mounted on the lower surface of the substrate.

14 Claims, 10 Drawing Sheets

(51) Int. Cl.
    *H01L 25/075*     (2006.01)
    *H01L 23/00*     (2006.01)

(52) U.S. Cl.
    CPC .......... *H01L 25/0756* (2013.01); *H01L 25/50* (2013.01); *H01L 33/62* (2013.01); *H01L 2224/16225* (2013.01); *H01L 2933/0066* (2013.01)

(56) References Cited

U.S. PATENT DOCUMENTS

| | | |
|---|---|---|
| 2004/0129944 A1 | 7/2004 | Chen |
| 2004/0226929 A1 | 11/2004 | Miura et al. |
| 2005/0207156 A1* | 9/2005 | Wang ................. F21K 9/00 362/240 |
| 2007/0052787 A1 | 3/2007 | Miura et al. |
| 2007/0194308 A1* | 8/2007 | Kuo .................. H01L 27/3267 257/40 |
| 2013/0313604 A1 | 11/2013 | Engl et al. |
| 2015/0366073 A1* | 12/2015 | Magdassi ............... C09D 11/52 174/257 |
| 2016/0126491 A1* | 5/2016 | Kostelnik ............... H01L 33/62 438/28 |
| 2016/0163940 A1 | 6/2016 | Huang et al. |
| 2017/0317048 A1* | 11/2017 | Matsubara ............. H01L 24/32 |
| 2018/0374834 A1* | 12/2018 | Tada ..................... H01L 25/13 |

* cited by examiner

SEMICONDUCTOR LIGHT-EMITTING DEVICE AND METHOD FOR PRODUCING THE SAME

TECHNICAL FIELD

The present invention relates to a device highly densely carrying semiconductor light-emitting elements on a substrate.

BACKGROUND ART

There have conventionally widely known a method of forming a circuit pattern by sticking copper foil on a substrate consisting of an epoxy resin containing glass fibers, or the like, masking the copper foil and etching the unmasked portions of the copper foil. In this method, it is necessary to secure a minimum circuit pattern width and pattern gap size for enabling processing for patterning by masking, but there is a limit in making the circuit pattern width smaller. Further, when electronic parts (light-emitting elements) are highly densely disposed on a circuit pattern, there is used an apparatus that carries such electronic parts, moves them to a circuit pattern, and disposes them at right positions determined by alignment. The gaps between adjacent electronic parts (light-emitting elements) must be larger than the alignment accuracy of such an apparatus as mentioned above, and therefore there is a limit in making the gap between electronic parts smaller.

Patent document 1 discloses a light source carrying, for the purpose of obtaining a highly bright LED illumination light source, a plurality of LED elements alternately mounted on every other substrate among two of overlappingly disposed mounting substrates, so that the LED elements are disposed in the shape of matrix when they are seen from above. As for two of the mounting substrates, a transparent substrate is used as the upper mounting substrate, so that the lights emitted by the LED elements carried on the lower mounting substrate transmit through the upper mounting substrate, and are projected upward together with the lights emitted by the LED elements carried on the upper mounting substrate.

As disclosed in Patent document 2, in the field of printed electronics, there has also been developed a method for forming a circuit pattern having smaller circuit pattern widths and pattern gaps by drawing (printing) a circuit pattern on a substrate by photogravure printing, flexographic printing, or the like with an ink mainly consisting of metal nanoparticles, and then irradiating the whole substrate with light to sinter the metal nanoparticles. In the method disclosed in Patent document 2, after a circuit pattern is printed with the conductive ink, a liquid medium contained in the ink is removed to a predetermined content (0.01 to 3 mass %) to prevent collapse of the circuit pattern until the sintering with light, and formation of holes in the inside of the circuit pattern at the time of the sintering with light.

PRIOR ART REFERENCES

Patent Documents

Patent document 1: Japanese Patent Unexamined Publication (KOKAI) No. 2006-49026
Patent document 2: Japanese Patent Unexamined Publication (KOKAI) No. 2014-17364

SUMMARY OF THE INVENTION

Object to be Achieved by the Invention

Since the technique of Patent document 1 employs a configuration that a plurality of the LED elements are disposed on facingly disposed two substrates, two substrates are required, and therefore the device cannot be made sufficiently compact. In addition, two of the substrates must be facingly disposed with a gap, it is also difficult to use flexible substrates.

In the technique of Patent document 2, after a circuit pattern is printed on a substrate with the conductive ink, light sintering is performed by irradiating the whole circuit pattern with light, and therefore the temperature of the whole substrate rises. Accordingly, if a substrate showing a low heatproof temperature such as a substrate consisting of resin is used, the substrate may expand, and the circuit pattern may be distorted. In particular, when a flexible substrate made of resin is used, distortion may be caused in the substrate itself by the light irradiation. Further, in the technique of Patent document 2, the metal nanoparticles are sintered with light so that holes should not be generated in the inside of the circuit pattern, therefore the circuit pattern obtained after the sintering shows poor flexibility, and when a flexible substrate is used, the circuit pattern may not be able to follow deflection of the substrate, and thus cracks may be generated in the circuit pattern, or the circuit pattern may peel from the substrate.

An object of the present invention is to provide a light-emitting device in which a plurality of light-emitting elements are closely adjacently disposed in spite of using only one substrate.

Means for Achieving the Object

In order to achieve the aforementioned object, the semiconductor light-emitting device of the present invention comprises a substrate having a circuit pattern on each of upper surface and lower surface thereof, one or more light-emitting elements flip-chip mounted on the upper surface of the substrate, and one or more light-emitting elements flip-chip mounted on the lower surface of the substrate. The light-emitting elements disposed on the upper surface of the substrate and the light-emitting elements disposed on the lower surface of the substrate are disposed so that they are adjacently disposed, when they are seen from above the substrate. The light-emitting elements mounted on the upper surface of the substrate have light-emitting surfaces as upper surfaces, the light-emitting elements mounted on the lower surface of the substrate have light-emitting surfaces on the substrate side, and the substrate transmits at least lights emitted by the light-emitting elements mounted on the lower surface of the substrate.

Effect of the Invention

According to the present invention, a plurality of light-emitting elements can be closely adjacently disposed on one substrate, and thus a semiconductor device having a high disposition density of light-emitting elements can be provided.

MODES FOR CARRYING OUT THE INVENTION

Embodiments of the semiconductor light-emitting device of the present invention will be explained below.
<First Embodiment>

Figure 1A:
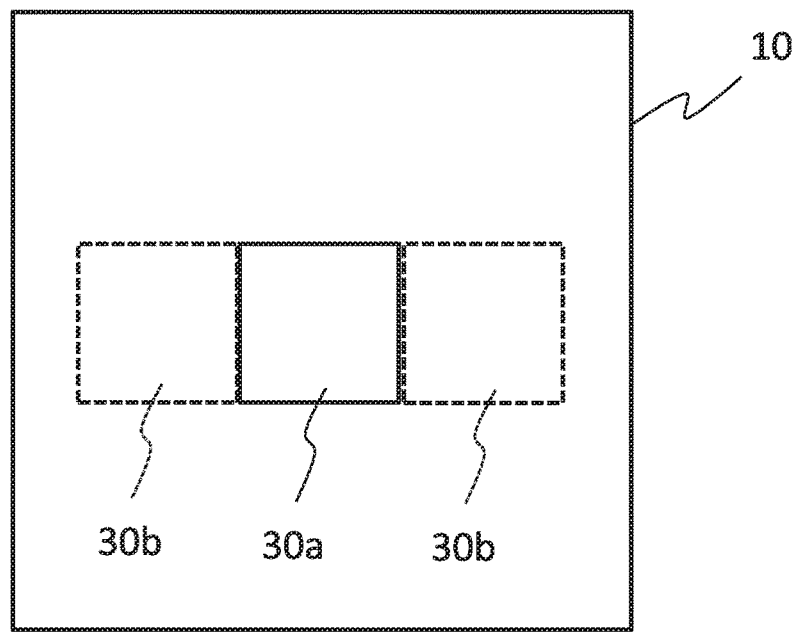
FIGS. 1A and 1B are a top view and sectional view of a semiconductor light-emitting device according to the first embodiment, respectively.
Figure 1B:
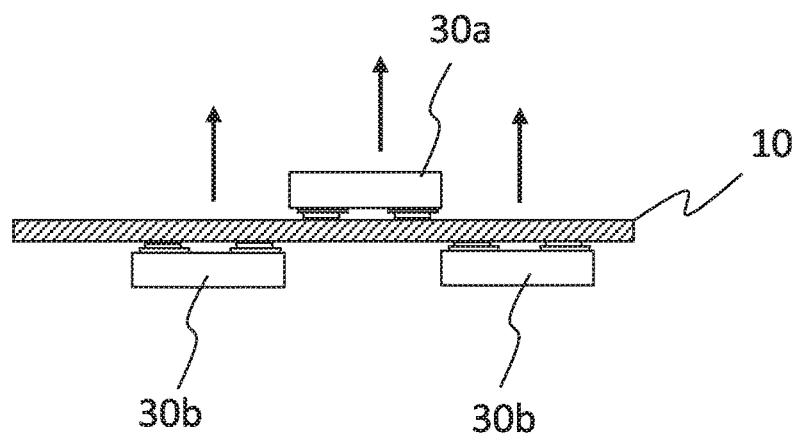
Figure 2A:
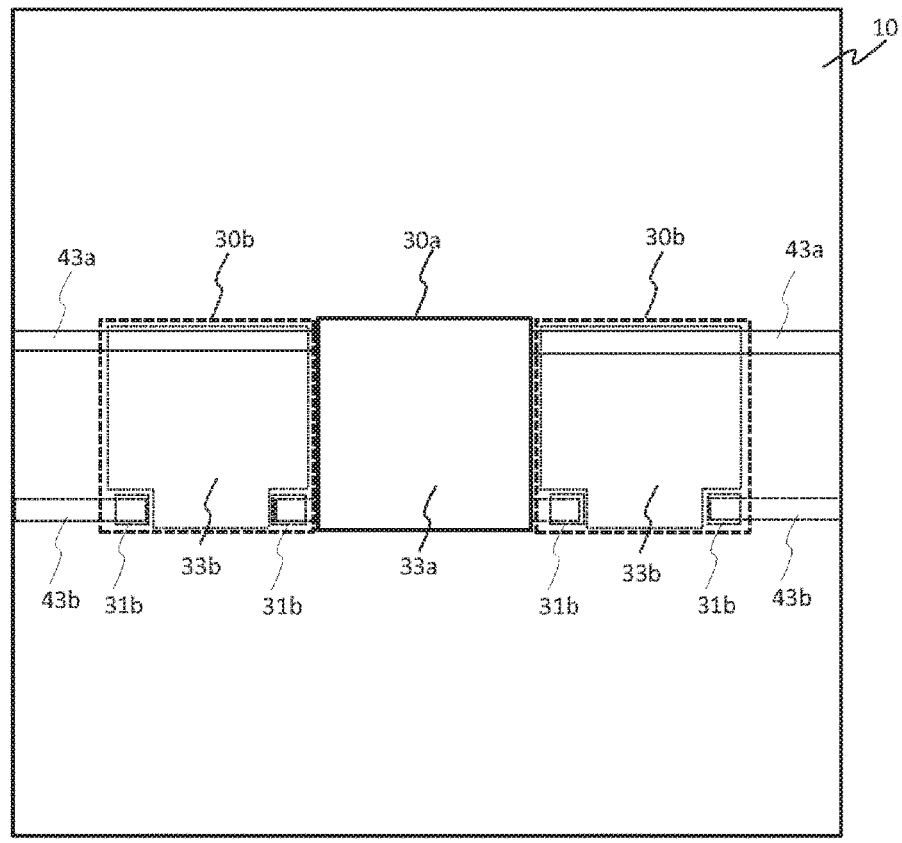
FIGS. 2A and 2B are an enlarged top view and enlarged sectional view of the semiconductor light-emitting device according to the first embodiment, respectively.
Figure 2B:
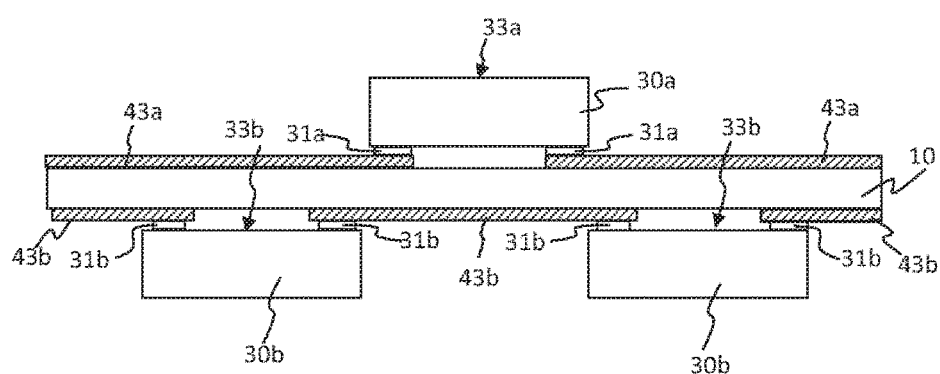

The semiconductor light-emitting device according to the first embodiment will be explained with reference to FIGS. 1A, 1B, and so forth. A top view and a sectional view of the semiconductor light-emitting device are shown as FIGS. 1A and 1B, respectively, and enlarged drawings thereof are shown as FIGS. 2A and 2B, respectively. The semiconductor light-emitting device of this embodiment comprises a substrate 10 having circuit patterns 43a and 43b on the upper surface and lower surface thereof, respectively, one or more of light-emitting elements 30a flip-chip mounted on the upper surface of the substrate 10, and one or more of light-emitting elements 30b flip-chip mounted on the lower surface of the substrate 10. As shown in FIG. 1A and FIG. 2A, the light-emitting elements 30a on the upper surface of the substrate 10 and the light-emitting elements 30b on the lower surface of the substrate 10 are disposed so that they are closely adjacent to each other when they are seen from above the substrate. For example, in the configuration shown in FIGS. 1A and 2A, the light-emitting elements 30a and 30b are disposed in a line in such a positional relationship that there are almost no gaps between respective adjacent light-emitting elements 30a and 30b, when they are seen from above.

The light-emitting elements 30a mounted on the upper surface of the substrate 10 are disposed so that light-emitting surfaces 33a thereof should face upward. The light-emitting elements 30b mounted on the lower surface of the substrate 10 are disposed so that light-emitting surfaces 33b thereof should face the substrate 10 side. The substrate 10 has a characteristic that it transmits at least lights emitted by the light-emitting elements 30b mounted on the lower surface of the substrate 10. As a result, as shown in FIG. 1B, the lights emitted from the light-emitting elements 30b on the lower surface of the substrate 10 transmit through the substrate 10 and are projected upward above the substrate 10 together with lights emitted from the light-emitting elements 30a on the upper surface of the substrate 10. If there is provided a semiconductor element, or a reflection layer, reflection material or the like in the proximity thereof as required for the lights that are projected upward, the lights can be efficiently projected upward.

Such a configuration as described above makes it possible to obtain a light source in which a plurality of light-emitting elements 30a and 30b are arranged substantially without any gaps in spite of using only one substrate 10.

When the substrate 10 is seen from above, parts of adjacent light-emitting elements 30a on the upper surface and the light-emitting elements 30b on the lower surface may overlap with each other. Because they are disposed on both surfaces, such a disposition of the adjacent light-emitting elements 30a and 30b that they partially overlap with each other is also possible.

There may also be employed a configuration that the light-emitting elements 30a on the upper surface and the light-emitting elements 30b on the lower surface emit lights of different colors. For example, by using a configuration that two or three kinds of light-emitting elements that emit lights of different wavelengths are closely adjacently disposed so that the light-emitting device emits a light of mixed color for the light-emitting device of this embodiment, emission of light of a uniform mixed color can be obtained with reduced unevenness of color.

The circuit patterns 43a and 43b desirably have a line width smaller than the sizes of the light-emitting elements 30a and 30b in the regions where they are connected with the light-emitting elements 30a and 30b, so that they should not shield the lights emitted from the light-emitting elements 30a and 30b. In particular, the line widths of the circuit patterns 43a and 43b are desirably smaller than sizes of electrodes 31a and 31b of the light-emitting elements 30a and 30b in the regions where they are connected with the light-emitting elements 30a and 30b.

Such circuit patterns 43a and 43b as described above can be formed by, for example, sintering conductive particles. The circuit patterns 43a and 43b are desirably porous. The circuit patterns 43a and 43b formed so as to be porous have flexibility. Therefore, even when a flexible substrate 10 is used, they can deform with following deflection of the substrate, and thus a flexible light-emitting device can be provided.

The circuit patterns 43a and 43b can also be constituted with different conductive materials according to colors of lights emitted by the light-emitting elements 30a and 30b. For example, red lights and infrared lights are reflected by 90% or more by a circuit pattern made of Au or Ag, whereas blue lights are reflected by 90% or more by a circuit pattern made of Ag, but the reflection rate thereof with a circuit pattern made of Au is 40% or lower. Therefore, for example, if the lights emitted from the light-emitting elements 30a on the upper surface of the substrate 10 are red lights, and it is desired to reflect also lights scattered to the circumference upward, it is desirable to form the circuit pattern 43a of circumferential parts of the upper surface, and the circuit pattern 43b on the lower surface with Au or Ag, but when the emitted lights are blue lights, it is desirable to use the circuit patterns 43a and 44b made of Ag. On the contrary, when it is desired to suppress upward reflection of lights scattered to the circumference, and the lights emitted by the light-emitting elements 30a on the upper surface are blue lights, it is desirable to use the circuit patterns 43a and 43b made of Au that show a low reflection rate. As described above, by choosing type of the material of the circuit patterns 43a and 43b, light to be reflected can be controlled.

The method for producing the semiconductor light-emitting device of the first embodiment will be explained with reference to FIGS. 3A to 3H.

Figure 3A:
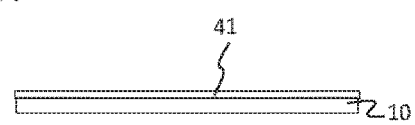
FIGS. 3A to 3H are explanatory drawings showing a method for producing a semiconductor light-emitting device according to the first embodiment.

First, as shown in FIG. 3A, a dispersion in which conductive particles and an insulating material are dispersed or a dispersion in which conductive particles coated with an insulating material layer are dispersed is applied to the surface of the substrate 10 in a desired shape. A film 41 of the conductive particle coated with the insulating material is thereby formed on the surface of the substrate 10. The solvent is evaporated to dry the film 41 with heating the film as required. The conductive particles are dispersed in the film 41 in a state that the surfaces of the conductive particles are covered with the insulating material. Therefore, in this step, the film 41 is non-conductive.

Figure 3B:
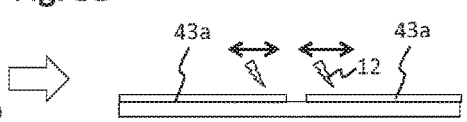

Then, as shown in FIG. 3B, the film 41 is irradiated with a light flux 12 of a predetermined shape. In a region of the film 41 irradiated with the light flux 12, the conductive particles absorb energy of the light, and the temperature thereof rises. As a result, the conductive particles melt at a temperature lower than the melting point of the bulk of the material constituting the particles, a large part of the surrounding insulating material layer is evaporated with the rise of the temperature of the conductive particles, and even if a part of the material remains, it is softened. Therefore, the melted conductive particles directly fuse with adjacent particles, or penetrate the softened insulating material layer and fuse with adjacent particles. The conductive particles are thereby sintered, and the conductive circuit pattern 43a is formed on the upper surface of the substrate 10. The melted conductive particles adhere to the substrate 10 during this process.

As described above, temperature of the conductive particles in the region of the film 41 irradiated with the light flux 12 rises due to the irradiation of light. This heat is used for sintering of the conductive particles, and at the same time, it conducts to the surrounding portions of the film 41 and the substrate 10, and radiated. Therefore, temperature of only the region of the film 41 irradiated with the light flux 12, or only the region irradiated with the light flux 12 and adjacent regions thereof reaches the temperature at which the conductive particles are sintered, and temperature of the film 41 of a part outside the aforementioned region and temperature of the substrate 10 do not reach the temperature at which the materials constituting them are melted or degraded.

That is, according to this embodiment, only a part of the film 41 (region directly under the electrode 31) is irradiated with the light flux 12, therefore heat can be conducted to the substrate 10 and the surrounding part of the film 41 and radiated, and temperature rise of the substrate 10 can be suppressed. Accordingly, even if the substrate 10 consists of a material that is easily deformed by heat such as a thin and flexible resin material, deformation, distortion, and denaturation such as opacification of the substrate possibly caused by the light sintering can be prevented. In addition, when the substrate 10 is flexible, the flexibility can be maintained.

Figure 4:
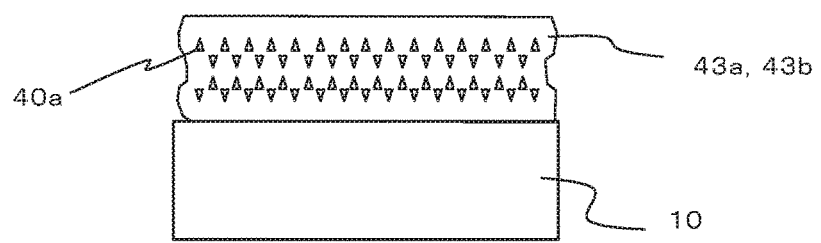
FIG. 4 is an explanatory drawing showing that a circuit pattern formed according to the first embodiment is porous.

In the step of FIG. 3B, it is desirable to form the circuit pattern 43a so as to be porous as shown in FIG. 4. That is, it is desirable that the light sintering is performed at such a temperature that the whole conductive particles are not completely melted and mixed, but adjacent conductive particles are fused only at contacting surfaces thereof so that voids 40a are formed between at least a part of the sintered conductive particles. For example, if a laser light is used as the light flux 12, and irradiated on the film 41 at such an irradiation intensity that the substrate 10 through which the light transmits is not melted, comparatively large energy can be given to the region of the film 41 irradiated with the light flux 12 in a short period of time, thus the conductive particles can be melted by heating and sintered, and by terminating the irradiation of the light flux 12 of the laser light, cooling can be quickly attained by heat conduction to a surrounding part of the film 41 and the substrate 10. Therefore, a porous circuit pattern can be formed.

In other words, when the sintering is performed in the film 41 with the light flux 12 of laser light, a porous electrode connection region 40 can be formed by adjusting radiation intensity of the light flux 12 so that the film 41 should have an appropriate temperature. Specifically, by using a stretched polyethylene terephthalate (PET) film (melting point, about 250° C.; heatproof temperature, about 150° C.) as the substrate 10, and irradiating the substrate 10 with the light flux 12 of laser light from the back surface of the substrate 10 with adjusting the intensity of the light flux so that shape of the substrate is maintained to sinter the conductive particles of the film 41, the porous circuit pattern 43a can be formed.

If the circuit pattern 43a is porous, the circuit pattern 43a itself has shape-following property (flexibility) as described above. Therefore, even if the flexible substrate 10 is deformed, the circuit pattern 43a also deforms to follow the substrate, thus the circuit pattern 43a does not easily peel from the substrate 10, and cracks and so forth are not easily produced, either. As a result, there can be provided a flexible mounting substrate that does not easily produce disconnection.

As for shape of the light flux 12 irradiated on the film 41 in the step shown in FIG. 3B, the light flux 12 may be shaped into the shape of the circuit pattern 43a by passing it through a mask, and then irradiated, or the shape of the circuit pattern 43a may be scanned with the light flux 12 having a round or rectangular irradiation spot shape so that the light flux 12 is irradiated in the shape of the circuit pattern 43a.

Figure 3C:
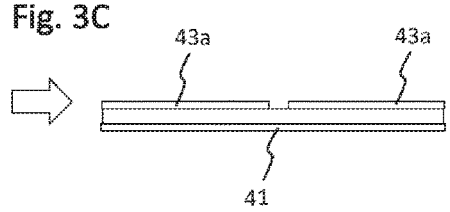
Figure 3D:
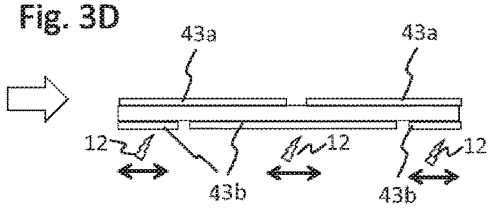

Then, the process advances to the step of FIG. 3C, where the film 41 is formed on the lower surface of the substrate 10 in the same manner as that of the step of FIG. 3A. In the step of FIG. 3D, the light flux 12 is irradiated on the film 41 in the same manner as that of the step of FIG. 3B to form the circuit pattern 43b.

Figure 3E:
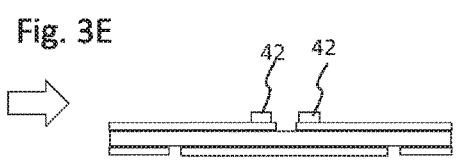

As shown in FIG. 3E, bumps 42, solder balls, and so forth are provided on the circuit pattern 43a as required.

Figure 3F:
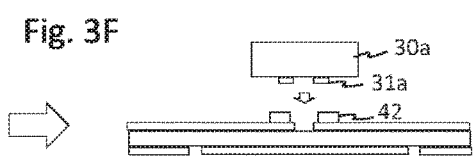
Figure 3G:
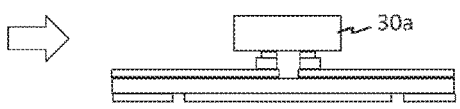
Figure 3H:
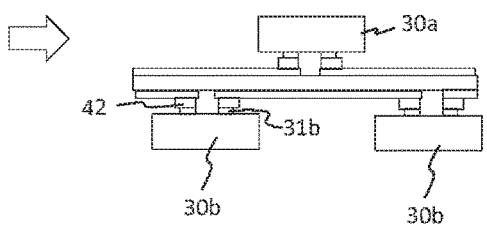

As shown in FIG. 3F, the light-emitting element 30a is aligned so that the electrodes 31a thereof correspond to the circuit pattern 43a, and mounted. When the bumps 42 or the like are disposed, the light-emitting element 30a is aligned so that the positions of the bumps 42 correspond to the positions of the electrodes 31a of the light-emitting element 30a. Then, they are heated or applied with a supersonic wave to connect the electrodes 31a of the light-emitting element 30a with the circuit pattern 43a and thereby fix the light-emitting element 30a (FIG. 3G). If needed, an adhesive layer may be filled between the bottom surface of the light-emitting element 30a and the upper surface of the substrate 10. The electrode 31a and the circuit pattern 43a may also be connected by sintering conductive particles between them in the same manner as that used for the film 41 by using a dispersion in which conductive particles and an insulating material are dispersed or a dispersion in which conductive particle coated with an insulating material layer are dispersed.

Similarly, the light-emitting element 30b is also disposed on the back face of the substrate, and the electrodes 31b are connected to the circuit pattern 43b (FIG. 3F). Since the intervals of a plurality of the light-emitting elements 30b disposed on the lower surface of the substrate 10 are sufficiently large and equivalent to the size of the light-emitting elements 30a disposed on the upper surface, a plurality of the light-emitting elements 30b can be easily disposed on the lower surface of the substrate 10 without any risk that a plurality of the light-emitting elements 30b contact with each other.

By the steps explained above, the fine circuit patterns 43a and 43b can be formed on the upper and lower surfaces of the substrate through such easy steps as application and light irradiation, and the light-emitting device shown in FIGS. 1 and 2 in which the light-emitting elements 30a and 30b are alternately disposed on both sides of the substrate 10 can be produced.

In the steps shown in FIGS. 3B and 3D, there is used the light flux 12 of such a wavelength that the light flux can be absorbed by the conductive particles contained in the film 41. The light to be irradiated may be any of ultraviolet, visible, and infrared lights. For example, when particles of Ag, Cu, Au, Pd, or the like are used as the conductive particles, a visible light of 400 to 600 nm can be used.

When there is a region of the film 41 that is not irradiated with the light, sintering does not occur in this region, and therefore it remains to be non-conductive. Such a non-conductive portion of the film 41 may be removed in the following step. For example, such a portion of the film 41 can be removed by using an organic solvent or the like. For such a non-conductive portion of the film 41, sintering can also be performed by additionally irradiating light or heating it.

The substrate 10 may consist of any material, so long as at least the surface thereof is insulating, it has such a translucency that irradiation of the light flux 12 through it is possible, and it can bear the temperature that the substrate 10 reaches at the time of irradiation of the light flux 12 on the film 41. There can be used, for example, organic materials such as polyethylene terephthalate (PET), polyethylene naphthalate (PEN), polycarbonate (PC), polystyrene (PS), polyimide, epoxy, silicone, glass/epoxy resin substrate, and paper/phenol resin substrate, and inorganic materials such as ceramics and glass. The substrate 10 may also consist of a flexible printed circuit board or a metal substrate of which surface is coated with an insulating layer, so long as at least a part of irradiated light can transmit through it. The substrate 10 in the form of a film can also be used.

As material of the conductive particles contained in the film 41, one or more kinds of conductive metals and conductive metal oxides of Au, Ag, Cu, Pd, Ni, ITO, Pt, Fe, and so forth can be used. As for particle size of the conductive particles, the conductive particles may consist only of nanoparticles having a particle size smaller than 1 µm, or a mixture of nanoparticles having a particle size smaller than 1 µm and microparticles having a particle size not smaller than 1 µm.

As the insulating material at least contained in the film 41, or the insulating material that coats the conductive particles contained in the film 41, there can be used one or more kinds of materials selected from organic materials such as styrene resin, epoxy resin, silicone resin, and acrylic resin, inorganic materials such as $SiO_2$, $Al_2O_3$, and $TiO_2$, and organic and inorganic hybrid materials. Thickness of the insulating material layer that coats the conductive particles in the film 41 is preferably about 1 nm to 10 µm. If the insulating material layer is unduly thin, withstand voltage of the non-conductive film 41 is degraded. If the insulating material layer is unduly thick, the electric conductivity of the circuit patterns 43a and 43b obtained after sintering by light irradiation is degraded, and thus resistance becomes higher.

The conductive particles and the insulating material, or the conductive particles coated with the insulating material layers are made into a dispersion to be applied in the step shown in FIG. 3A by dispersing them in a solvent. As the solvent, an organic solvent or water can be used.

As for size of the circuit patterns 43a and 43b, they can be formed to have, for example, a width of 1 µm or larger, and a thickness of about 1 nm to 10 µm. Electric resistivity of the circuit patterns 43a and 43b is desirably $10^{-4}$ Ω·cm or lower, particularly desirably such a low resistance as $10^{-6}$ Ω·cm order.

Any kind of light-emitting element may be used as the light-emitting elements 30a and 30b, and for example, LED, light-receiving element, LD, and display devices (liquid crystal display device, plasma display device, EL display device, etc.) can be used. As LED, InGaN type LED that emits, for example, blue light (wavelength 460 nm), InGaN type LED that emits, for example, green light (wavelength 520 nm), and AlGaInP type LED that emits, for example, red light (wavelength 620 nm) can be used. The light-emitting element is not limited to those of these wavelengths, and any light-emitting element that emits ultraviolet light, visible light, infrared light, or the like may be used. It is also possible to mount light-receiving elements instead of the light-emitting elements 30a and 30b to constitute a light-receiving device. It is also possible to mount two or more kinds of these elements in a mixed state.

As the method for forming the film 41 in the steps shown in FIGS. 3A and 3C, any method may be used, so long as it is a method by which the film 41 of a desired thickness can be formed. When the film 41 is formed by printing, gravure printing, flexographic printing, ink jet printing, screen printing, and so forth can be used.

Figure 5:
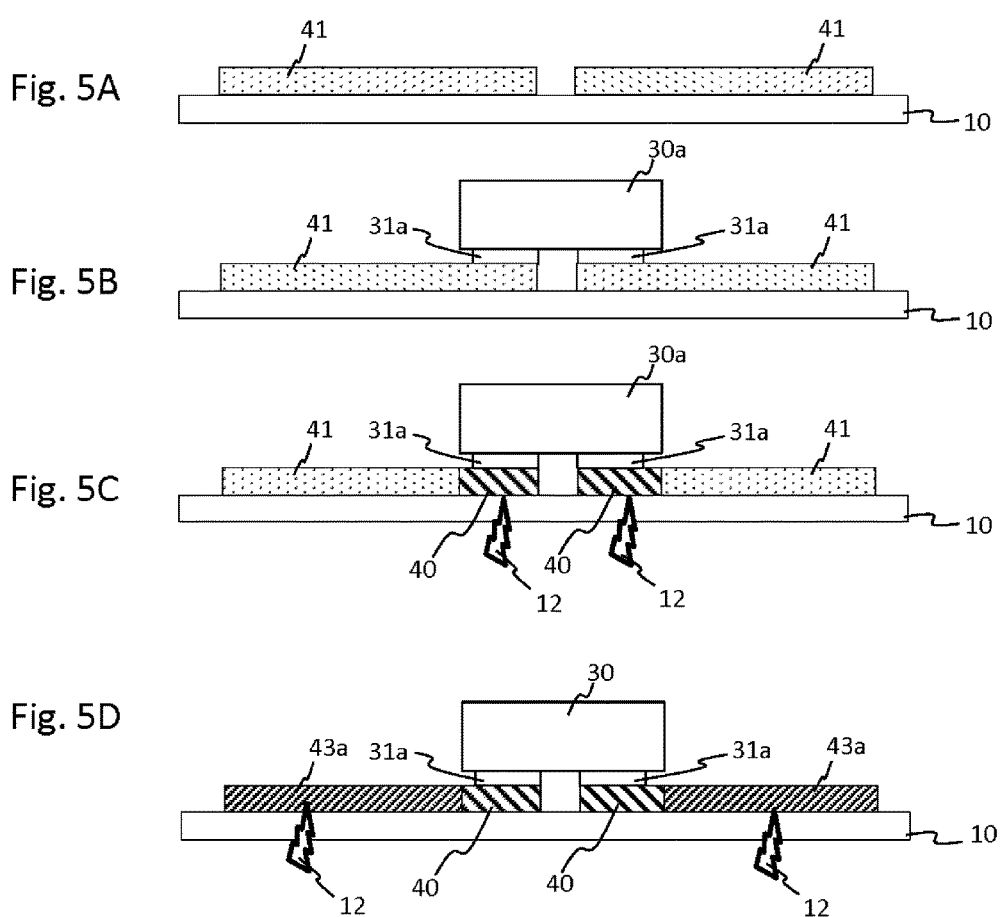
FIGS. 5A to 5D are explanatory drawings showing another method for producing a semiconductor light-emitting device according to the first embodiment.

In the explanation of this embodiment described above, the film 41 on the substrate 10 is irradiated with the light flux 12 from above. However, if a substrate that can transmit the light flux 12 is used as the substrate 10, the light flux 12 may be transmitted through the substrate 10 and irradiated on the film 41 as shown in FIG. 5. According to this method, for example, the formation of the circuit pattern 43a and connection between the light-emitting element 30 and the circuit pattern 43a can be simultaneously or successively performed by irradiation of the light flux 12, and it is not necessary to use bumps or the like. Specifically, the film 41 is formed as shown in FIG. 5A, and then the light-emitting element 30a is disposed on the film 41 so that the electrode 31a should contact with the film 41 as shown in FIG. 5B. Then, the region between the electrode 31 and the substrate 10 is irradiated with the light flux 12 from the side of the lower surface of the substrate 10 to perform light sintering of the conductive particles of the film 41, and thereby form the electrode connection region 40. Thereafter, a region of the circuit pattern 43a to be connected to the electrode connection region 40 is irradiated with the light flux 12 through the substrate 10 to form the circuit pattern 43a.

As for the lower surface side of the substrate 10, the electrode connection region 40 of the light-emitting element 30b and the circuit pattern 43b may be formed by irradiating the light flux 12 from the side of the upper surface of the substrate 10 as shown in FIG. 5, or the connection may be made by using the bumps 42 as shown in FIG. 3.

In the above explanation of the first embodiment, the sintering of the particles in the film 41 is performed by irradiating the light flux. However, the same functions and effects can be obtained even by using a method other than light flux irradiation, if the method is a method that can supply energy to only a part of the film 41 to heat it. For example, a method of irradiating converged microwaves, or a method of contacting a needlelike probe with the film or bringing the same close to the film, and locally supplying electric current or electric power can be used.

<Second Embodiment>

Figure 6:
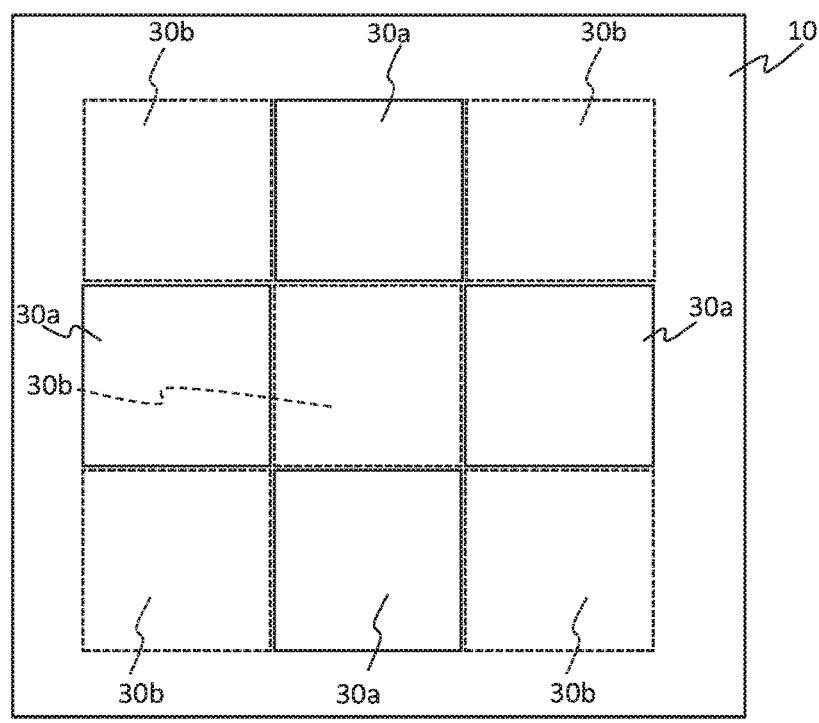
FIG. 6 is a top view of a semiconductor light-emitting device according to the second embodiment.

As the first embodiment, there has been explained a light-emitting device having the light-emitting elements 30a and 30b disposed in lines when they are seen from above. However, such a structure in which the light-emitting elements 30a and 30b are disposed in the form of matrix as shown in FIG. 6 is also possible. The light-emitting device shown in FIG. 6 can be realized by successively disposing three lines of the light-emitting elements of the first embodiment shown in FIGS. 1 and 2. In this light-emitting device, if the position of the light-emitting element 30a disposed on the upper surface of the substrate 10, and the position of the light-emitting element 30b disposed on the lower surface are exchanged for the center line, there is obtained a structure that the adjacent light-emitting elements 30a and 30b of different lines are not disposed on the same surface of the substrate 10 for both the longitudinal direction and transverse direction, but they are alternately disposed on the upper surface and lower surface.

As a result, there can be obtained a light source (light-emitting device) in the form of matrix where the light-emitting elements are disposed so that the light-emitting elements on the upper surface of the substrate 10 and the light-emitting elements on the lower surface of the same are closely adjacent to each other for the two-dimensional directions when they are seen from above the substrate. Thus, there can be provided a light-emitting device in which light-emitting elements are highly densely disposed.

The process steps and configurations of the second embodiment other than those explained above are the same as those of the first embodiment, and therefore explanations thereof are omitted.

<Third Embodiment>

As the third embodiment, variations of the first and second embodiments will be explained with reference to FIGS. 7 to 10.

Figure 7A:
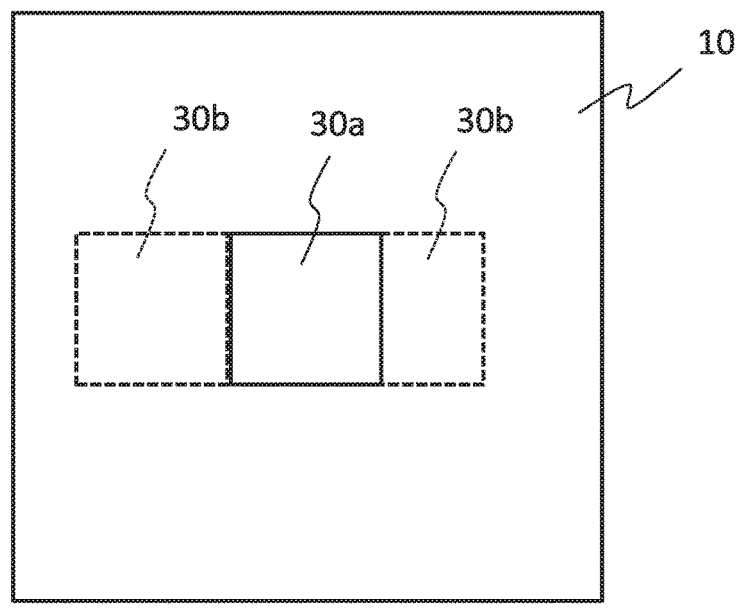
FIGS. 7A and 7B are a top view and sectional view of a variation of the semiconductor light-emitting device according to the third embodiment.
Figure 7B:
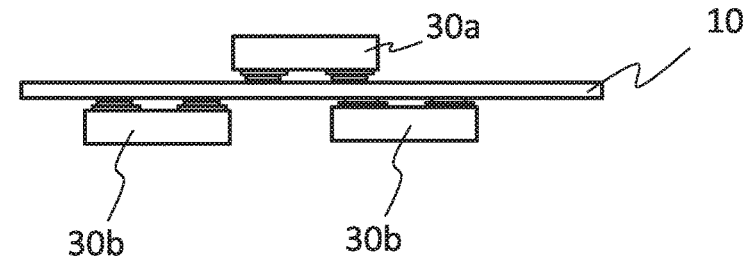

FIGS. 7A and 7B show a light-emitting device having the same configuration as that of the light-emitting device of the first embodiment shown in FIG. 1, except that the light-emitting element 30a disposed on the upper surface of the substrate 10 and the light-emitting element 30b disposed on the lower surface partially overlap with each other.

Figure 8A:
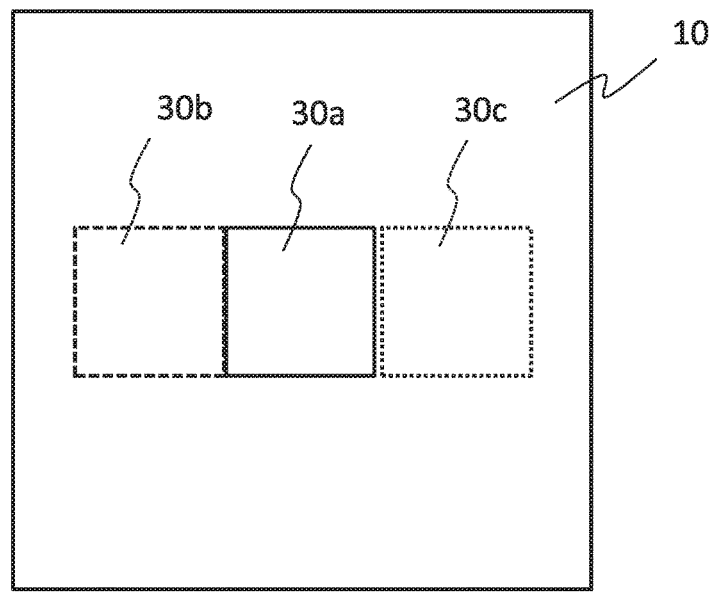
FIGS. 8A and 8B are a top view and sectional view of a variation of the semiconductor light-emitting device of the third embodiment.
Figure 8B:
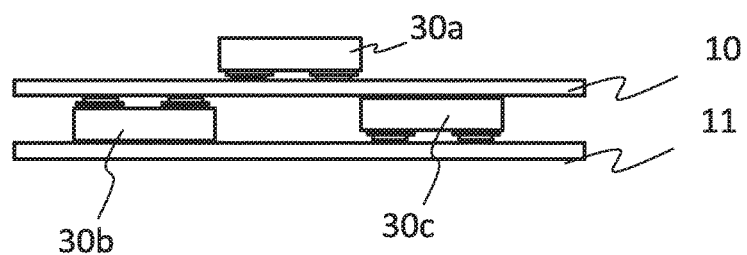

The light-emitting device shown in FIGS. 8A and 8B has a configuration that a substrate 11 is facingly disposed under the substrate 10 carrying the light-emitting elements 30a and 30b on the upper surface and lower surface, respectively, and a light-emitting element 30c is disposed on the substrate 11. The light-emitting surface of the light-emitting element 30c is the upper surface thereof, and light emitted from the light-emitting element 30c transmits through the substrate 10, and is projected upward above the substrate 10. Such a structure as described above where another substrate 11 is facingly disposed with the substrate 10, and a part of the light-emitting elements, light-emitting element 30c, is carried on the substrate 11 is also possible.

Figure 9A:
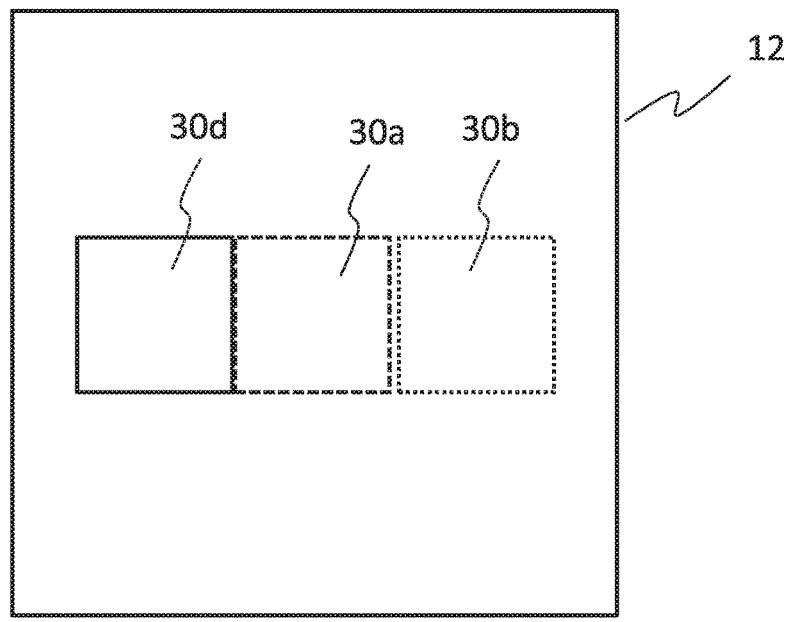
FIGS. 9A and 9B are a top view and sectional view of a variation of the semiconductor light-emitting device of the third embodiment.
Figure 9B:
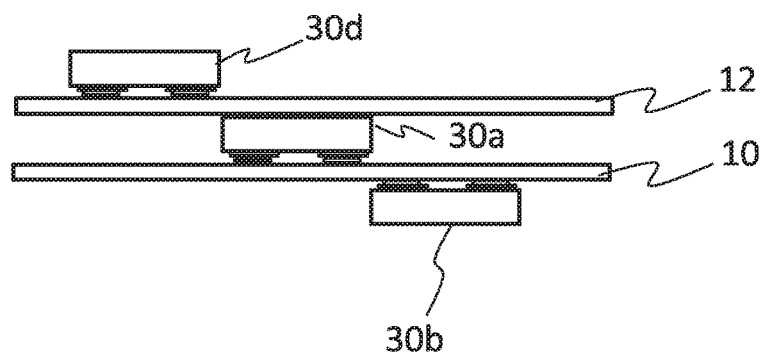

FIGS. 9A and 9B show a configuration that a substrate 12 is facingly disposed above the substrate 10 carrying the light-emitting elements 30a and 30b on the upper surface and lower surface, respectively, and a light-emitting element 30d is disposed on the substrate 12. The light-emitting surface of the light-emitting element 30d is the upper surface thereof. The substrate 12 transmits lights emitted by the light-emitting elements 30a and 30b. Therefore, the lights emitted from the light-emitting elements 30a and 30b transmit through the substrate 12, and are projected upward together with the light emitted from the light-emitting element 30d.

Figure 10A:
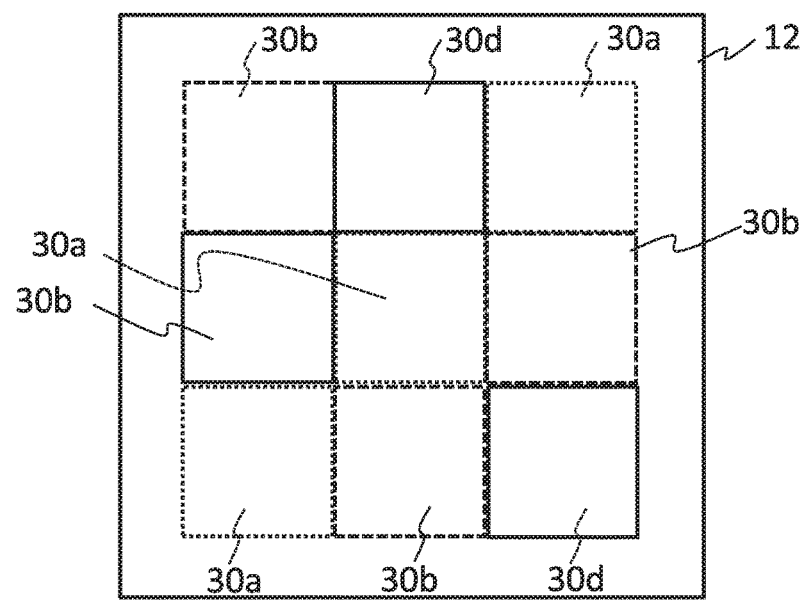
FIGS. 10A and 10B are a top view and sectional view of a variation of the semiconductor light-emitting device of the third embodiment.
Figure 10B:
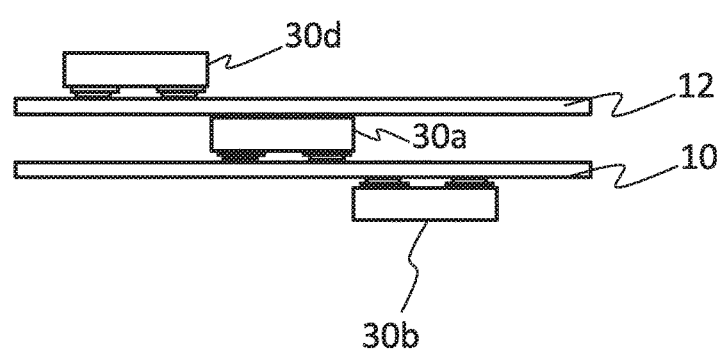

The light-emitting device shown in FIGS. 10A and 10B has a structure that the substrate 12 is facingly disposed above the substrate 10 as in the configuration shown in FIGS. 9A and 9B, and the light-emitting elements 30a, 30b, and 30d are disposed in the form of matrix when they are seen from above.

The process steps and configurations of the third embodiment other than those explained above are the same as those of the first embodiment, and therefore explanations thereof are omitted.

The semiconductor light-emitting device of the present invention can be applied to any devices carrying light-emitting elements on a substrate. For example, it can be applied to instrument panels (meter dashboards) of automobiles, display areas of game machines, and so forth. Further, since the substrate can be bended, it can be applied to wearable (attachable to the body) semiconductor light-emitting devices (glasses, clocks, displays, medical equipments, etc.) and curved displays.

DESCRIPTION OF NOTATIONS 10, 11, 12 . . . Substrate, 30a, 30b, 30c, 30d . . . light-emitting element, 31 . . . electrode, 40 . . . electrode connection region, 43a, 43b circuit pattern, 41 . . . film, 42 . . . bump

What is claimed is:

1. A semiconductor light-emitting device comprising:
a substrate having a circuit pattern on each of an upper surface and a lower surface thereof, the circuit patterns being porous;
one or more light-emitting elements flip-chip mounted on the upper surface of the substrate; and
one or more light-emitting elements flip-chip mounted on the lower surface of the substrate,
wherein:
the light-emitting elements disposed on the upper surface of the substrate and the light-emitting elements disposed on the lower surface of the substrate are disposed so that they are adjacently disposed, when they are seen from above the substrate,
the light-emitting elements mounted on the upper surface of the substrate have light-emitting surfaces as upper surfaces thereof, and the light-emitting elements mounted on the lower surface of the substrate have light-emitting surfaces on the substrate side,
the substrate transmits at least lights emitted by the light-emitting elements mounted on the lower surface of the substrate,
colors of emission lights of the light-emitting elements on the upper surface of the substrate and the light-emitting elements on the lower surface, which are adjacently disposed when they are seen from above the substrate, are different from each other, and
the circuit patterns are constituted by different conductive materials depending on colors of emission lights of the light-emitting elements.

2. The semiconductor light-emitting device according to claim 1, wherein the circuit patterns are obtained by sintering conductive particles.

3. The semiconductor light-emitting device according to claim 1, wherein a line width of the circuit patterns is not larger than sizes of the light-emitting elements.

4. The semiconductor light-emitting device according to claim 3, wherein the light-emitting elements have electrodes, and the line width of the circuit patterns is not larger than sizes of the electrodes.

5. The semiconductor light-emitting device according to claim 1, wherein the light-emitting elements on the upper surface of the substrate and the light-emitting elements on the lower surface of the substrate are adjacently disposed without any gaps when they are seen from above the substrate.

6. The semiconductor light-emitting device according to claim 1, wherein the light-emitting elements on the upper surface of the substrate and the light-emitting elements on the lower surface of the substrate partially overlap with each other when they are seen from above the substrate.

7. The semiconductor light-emitting device according to claim 1, wherein the substrate is flexible.

8. The semiconductor light-emitting device according to claim 7, wherein the light-emitting elements on the upper surface of the substrate and the light-emitting elements on the lower surface of the substrate are adjacently disposed without any gaps when they are seen from above the substrate.

9. The semiconductor light-emitting device according to claim 7, wherein the light-emitting elements on the upper surface of the substrate and the light-emitting elements on the lower surface of the substrate partially overlap with each other when they are seen from above the substrate.

10. The semiconductor light-emitting device according to claim 7, wherein a line width of the circuit patterns is not larger than sizes of the light-emitting elements.

11. The semiconductor light-emitting device according to claim 10, wherein the light-emitting elements have electrodes, and the line width of the circuit patterns is not larger than sizes of the electrodes.

12. A method for producing a semiconductor light-emitting device, the semiconductor light-emitting device comprising a substrate having a circuit pattern on each of an upper surface and a lower surface thereof, one or more light-emitting elements being flip-chip mounted on the upper surface of the substrate, and one or more light-emitting elements being flip-chip mounted on the lower surface of the substrate, the light-emitting elements disposed on the upper surface of the substrate and the light-emitting elements disposed on the lower surface of the substrate being disposed so that they are adjacently disposed, when they are seen from above the substrate, the light-emitting elements mounted on the upper surface of the substrate having light-emitting surfaces as upper surfaces thereof, and the light-emitting elements mounted on the lower surface of the substrate having light-emitting surfaces on the substrate side, and the substrate transmitting at least lights emitted by the light-emitting elements mounted on the lower surface of the substrate, and the method comprising:
- a film formation step of applying a dispersion in which conductive particles and an insulating material are dispersed or a dispersion in which conductive particles coated with an insulating material layer are dispersed on a surface of the substrate that transmits light to form a film of conductive particles coated with the insulating material;
- a circuit pattern formation step of irradiating a light flux on the film to sinter the conductive particles of only a region of a part of the film, and thereby form the circuit pattern adhered to the substrate;
- a light-emitting element mounting step of mounting the light-emitting elements having electrodes so that the electrodes contact with the film after the film formation step; and
- a connection region formation step of irradiating a light flux on a region of the film that contacts with the electrode through the substrate from the side of the substrate opposite to the side carrying the film to sinter the conductive particles of the region that contacts with the electrode, and thereby form an electrode connection region adhered to the electrode and the surface of the substrate facing the electrode.

13. The method according to claim 12, wherein a diameter of the irradiation of the light flux on the film is smaller than that of the electrode.

14. The method according to claim 12, wherein the circuit pattern formation step is performed successively to the connection region formation step by irradiating the light flux through the substrate on a region of a part of the film from the side of the substrate opposite to the side carrying the film.

* * * * *